(12) United States Patent
Tews et al.

(10) Patent No.: US 6,358,867 B1
(45) Date of Patent: Mar. 19, 2002

(54) ORIENTATION INDEPENDENT OXIDATION OF SILICON

(75) Inventors: Helmut Horst Tews, Poughkeepsie; Jonathan E. Faltermeir, LaGrange; Rajeev Malik, Pleasantville; Carol Heenan, LaGrangeville; Oleg Gluschenkov, Poughkeepsie, all of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/596,097

(22) Filed: Jun. 16, 2000

(51) Int. Cl.$^7$ .............................................. H01L 21/31
(52) U.S. Cl. ...................... 438/771; 438/770; 438/787; 438/788; 438/973; 438/198
(58) Field of Search ................................ 438/770, 772, 438/773, 774, 787, 771, 788, 973, 198

(56) References Cited

U.S. PATENT DOCUMENTS

| 4,409,260 | A | * | 10/1983 | Pastor et al. .................. 427/82 |
|---|---|---|---|---|
| 4,649,625 | A | | 3/1987 | Lu |
| 4,833,516 | A | | 5/1989 | Hwang et al. |
| 5,467,305 | A | | 11/1995 | Bertin et al. |
| 5,753,947 | A | | 5/1998 | Gonzalez |
| 5,937,296 | A | | 8/1999 | Arnold |
| 5,981,332 | A | | 11/1999 | Mandelman et al. |
| 6,008,104 | A | | 12/1999 | Schrems |
| 6,114,257 | A | * | 9/2000 | Ronsheim .................. 438/779 |

* cited by examiner

Primary Examiner—Carl Whitehead, Jr.
Assistant Examiner—Christy Novacek

(57) ABSTRACT

A method for forming an oxide of substantially uniform thickness on at least two crystallographic planes of silicon, in accordance with the present invention, includes providing a substrate where silicon surfaces have at least two different crystallographic orientations of the silicon crystal. Atomic oxygen (O) is formed for oxidizing the surfaces. An oxide is formed on the surfaces by reacting the atomic oxygen with the surfaces to simultaneously form a substantially uniform thickness of the oxide on the surfaces.

22 Claims, 9 Drawing Sheets

ORIENTATION INDEPENDENT OXIDATION OF SILICON

BACKGROUND

1. Technical Field

This disclosure relates to semiconductor fabrication and more particularly, to a method for forming a high quality silicon oxide which is uniform in thickness on more than one crystallographic silicon surface.

2. Description of the Related Art

Three-dimensional (3D) integrated circuits offer an extremely high density of electronic devices per unit of surface area. Various 3D memory cells include vertical field effect transistors with their gates placed on the vertical wall of a via or a trench. Because the vertical walls of an opening may have more than one crystallographic orientation of Si crystal, the thin gate dielectric film has to be formed on silicon surfaces with different crystallographic orientations for the silicon.

The gate insulator layer has to be substantially uniform and have a high quality Si/insulator interface for proper operation of a transistor.

Silicon dioxide ($SiO_2$) or silicon oxynitride ($SiO_xN_y$) grown by thermal oxidation of Si in different oxygen-bearing ambients are known to have a high quality Si interface; however, the rate of silicon oxidation is different for Si planes with different crystal orientation. (see, for example, FIGS. 1–4).

Referring to FIG. 1, an oxidation rate of silicon oxide films are shown as a ratio of the oxidation rate in the (100) crystal plane and the oxidation rate in the (110) crystal plane versus temperature. The data displayed was published by E. A. Irene, H. Z. Massoud, and E. Tierny in J. Electrochem. Soc. 133, 1253 (1986).

Referring to FIG. 2, a dry rapid thermal oxidation (RTO) process is graphically shown in a plot of oxidation thickness versus time for the (100) crystal plane and the (110) crystal plane of silicon. Referring to FIG. 3, a dry oxidation process is plotted for oxidation thickness versus time for the (100) crystal plane and the (110) crystal plane of silicon. FIG. 4 shows a wet (water vapor furnace) oxidation process plotted for oxidation thickness versus time for the (100) crystal plane and the (110) crystal plane of silicon.

FIGS. 1–4 show the disparity in thickness and oxidation rates for oxides on silicon with respect to the different crystallographic planes of silicon. It is, therefore, a challenge to grow a high-quality uniform film on the Si surface with more than one crystallographic orientation.

Referring to FIG. 5, a cross-sectional view of a trench 10 formed vertically (e.g., extending into the plane of the page) in a silicon substrate 12 is shown. The non-uniformity of a thin oxide film 14 grown thermally by a wet furnace method at 800 degrees C. for 8 minutes is shown. Oxide film 14 is grown on the sidewall surfaces of the vertical trench 10. The interior of the trench includes surfaces with the different crystallographic orientations of Si, namely (100) and (110). Consequently, the oxide film thickness varies along the trench perimeter depending on the crystal orientation. For example, the oxide film 14 is thicker at locations a, c, e and g corresponding to plane (110), and thinner at locations b, d, f and h corresponding to plane (100) as shown.

FIGS. 1–5 show that the oxidation rates depend strongly on the crystallographic orientation for standard oxidation processes. Rapid thermal processing (RTP) and furnace oxidation in both pure oxygen and water vapor result in a difference between the oxidation rates of (100) and (110) planes of between 40% and 100% depending on the ambient, processing temperature, and film thickness. There is a fundamental reason that explains this behavior. Si atoms have different packing density on different crystallographic planes. Generally, silicon oxide films grow faster on Si surfaces with higher atomic packing density.

Therefore, a need exists for growing an oxide, on silicon, of uniform thickness despite the presence of more than one crystallographic plane.

SUMMARY OF THE INVENTION

A method for forming an oxide of substantially uniform thickness on at least two crystallographic planes of silicon, in accordance with the present invention, includes providing a substrate including surfaces having at least two different crystallographic orientations of the silicon crystal. Atomic oxygen (O) is formed for oxidizing the surfaces. An oxide is formed on the surfaces by reacting the atomic oxygen with the surfaces to simultaneously form a substantially uniform thickness of the oxide on the at least two different crystallographic orientations of the surfaces.

Another method for forming an oxide of substantially uniform thickness on at least two crystallographic planes of silicon, in accordance with the present invention, includes the steps of providing a substrate, forming a continuous surface including at least two different crystallographic orientations of the silicon crystal on the substrate, forming atomic oxygen to react with the continuous surface, and forming an oxide on the continuous surface by reacting the atomic oxygen with the continuous surface to simultaneously form a substantially uniform thickness of the oxide on the at least two different crystallographic orientations.

In other methods, the step of forming atomic oxygen for oxidizing the surfaces may include the step of forming atomic oxygen by employing a free radical enhanced rapid thermal oxidation (FRE RTO) process. The step of forming atomic oxygen for oxidizing the surfaces may include the step of forming atomic oxygen by employing remote electrical discharge of oxygen. The step of forming atomic oxygen for oxidizing the surfaces may include the step of forming atomic oxygen by decomposing an unstable oxygen-bearing gas. The unstable oxygen-bearing gas may include ozone. The at least two different crystallographic orientations may include two of planes (100), (110) and (111). A maximum thickness difference of the oxide film grown on the at least two different crystallographic planes is less than 20%. The step of providing a substrate including surfaces having at least two different crystallographic orientations of the silicon crystal may include the step of forming a three dimensional structure in the substrate. The three-dimensional structure may include a trench, a pillar or a via. The step of annealing the oxide may be included. The step of annealing the oxide may include the step of annealing the oxide at a temperature between 600 degrees C. and 1200 degrees C. in an ambient. The ambient may include at least one of: $O_2$, $N_2$, $H_2$, $N_2O$, NO, $NH_3$, and Ar.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes a process which permits the formation of a high-quality thermal oxide on a silicon surface which has at least two different crystallographic orientations. Advantageously, the maximum thickness difference of the oxide films grown on different crystallographic planes with the present method is less than 20%. This method has been successfully applied to the fabrication of a uniform layer of high-quality oxide on the walls of a vertical trench, a pillar and other 3-D surfaces. Such vertical trench or pillar structures may be employed as part of a vertical field effect transistor formed on the walls of the trench and/or pillar.

Figure 6:
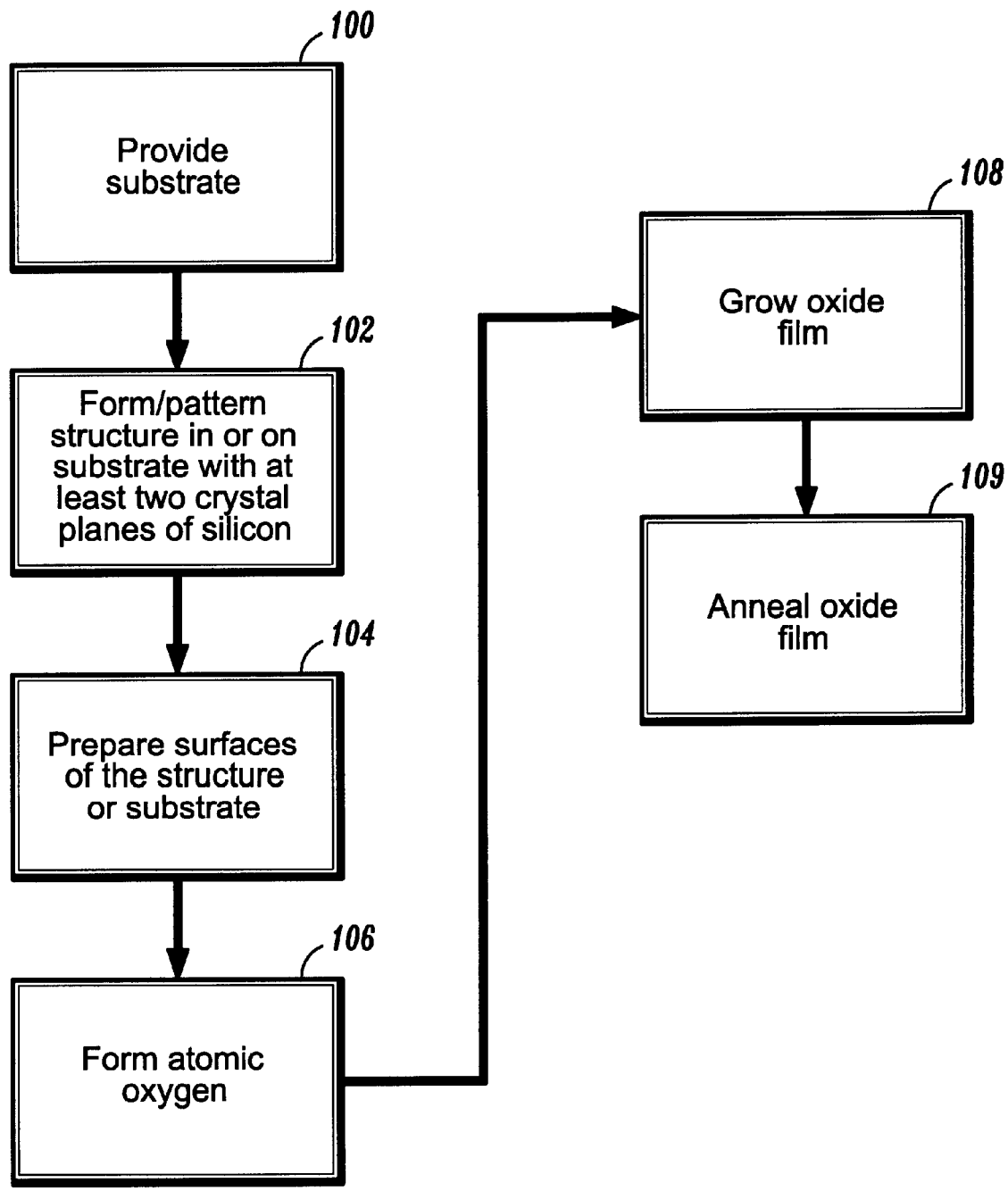
FIG. 6 is a flow diagram of a method of forming an oxide layer in accordance with the present invention.

Referring now in specific detail to the drawings in which like reference numerals identify similar or identical elements throughout the several views and initially to FIG. 6, a flow diagram of one method of the present invention is shown. The methods of the present invention may be employed for oxidizing silicon. In particularly useful embodiments, the present invention forms a high-quality uniform layer of oxide in more than one crystallographic plane of silicon. In block 100, a silicon substrate in the form of a wafer or chip is provided. The silicon wafer or chip includes a substrate on which an oxide layer is to be formed. The substrate preferably includes silicon. In block 102, the silicon structure may be prepared by forming or patterning the structure in the substrate. This may be performed by a combination of known microfabrication techniques. These techniques may include but are not limited to etching or non-epitaxial deposition, and photolithography. In this step, a desired three-dimensional (3D) structure is formed. The structure includes a silicon surface (or surfaces) which has/have at least two different crystallographic orientations of silicon crystal. The silicon surface(s) is/are exposed for oxidation. For example, the 3D structure may include a vertical trench etched in the crystalline layer of silicon. Other examples may include a surface of a silicon pillar grown epitaxially. Yet, another example of the structure includes a surface of grains of polycrystalline silicon where the silicon surfaces are exposed for oxidation.

In block 104, the surfaces of the silicon are prepared for oxidation. This step is optional depending on the prior processing steps in the flow. The preparation may include for example an etching process, such as a wet etch, using HF, or equivalent preparation steps may be employed. In a particularly useful embodiment, a silicon structure includes a continuous silicon surface having at least two different crystallographic orientations of the silicon crystal constructed on the wafer. For example, the crystal planes of silicon may include at least two of (100), (110) or (111).

In blocks 106 and 108, oxidation of the surface is performed by employing a process, which permits atomic oxygen to react with the silicon surface. Oxidation of the silicon surface by atomic oxygen may be provided in a remote electrical discharge process where $O_2$ is reduced to atomic oxygen (O) by electrical discharges. The atomic oxygen may also be provided by decomposition of ozone or other unstable oxygen-bearing gas.

In a preferred embodiment, atomic oxygen is provided by employing a mixture of $H_2$ and $O_2$ in a rapid thermal oxidation (RTO) process. In this process, silicon structures with different crystallographic planes are oxidized by a mixture of oxygen and hydrogen held at a low pressure. Hydrogen and oxygen are introduced into a process chamber and held at a low pressure of between about 100 Torr and about 0.1 Torr. The oxygen and hydrogen gases react in the volume of the chamber and at the surface of the silicon substrate producing a highly reactive mixture that rapidly oxidizes silicon surfaces. The temperature of the surfaces of silicon is preferably held between about 600° C. and about 1200° C. The process most likely carries out this oxidation with atomic oxygen, and therefore may be referred to as Free Radical Enhanced (FRE) RTO or FRE RTO. This oxidation method permits for a rapid oxidation of silicon with rates comparable to those of silicon oxidation in pure oxygen at 760 Torr. An oxide film grown with FRE RTO is of excellent electrical quality and is suitable for use as a gate insulator.

Figure 7:
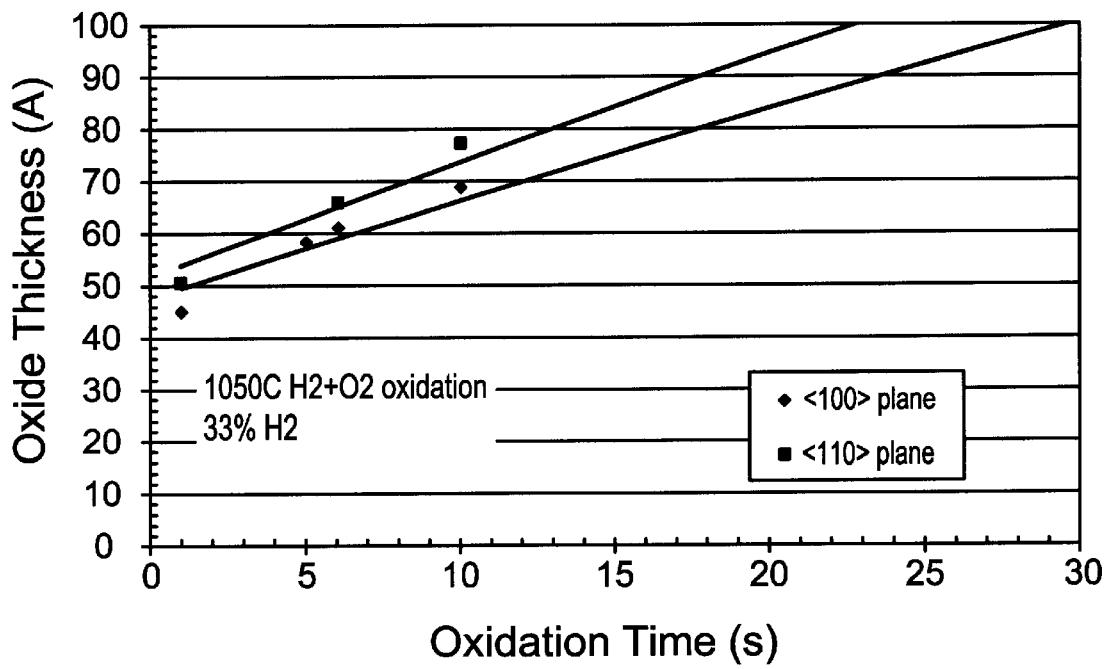
FIG. 7 is a plot of oxide thickness versus oxidation time for planes (100) and (110) of silicon for an in-situ steam generation in accordance with the present invention.

We have discovered that the FRE RTO process oxidizes different crystallographic planes of Si crystal with similar rates. Referring to FIG. 7, oxide thickness of a silicon oxide formed on a silicon crystal is plotted versus oxidation time. The process is an FRE RTO process performed at 1050° C. in 33% $H_2$.

Figure 8:
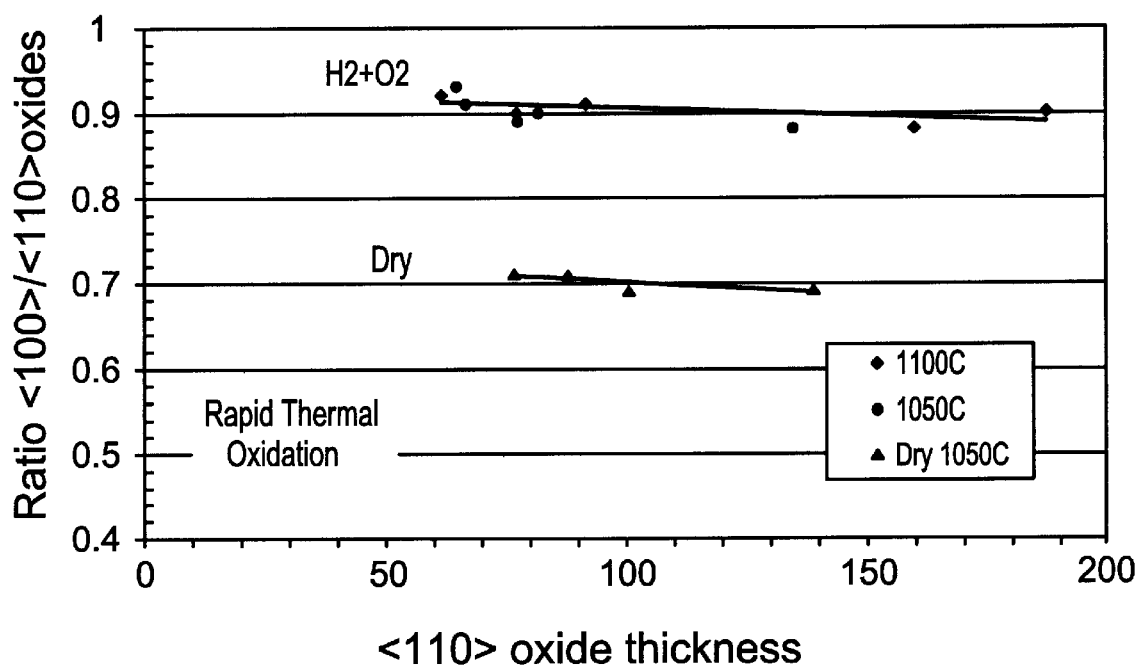
FIG. 8 is a plot of a ratio of the rate of oxidation between planes (100) and (110) of silicon versus (110) oxide thickness showing a comparison of the prior art dry rapid thermal oxidation process and the steam generation ($H_2+O_2$) process employed with the present invention.

FIG. 8, compares an ratio of the oxidation (or oxide thickness) for planes (100) and (110) of silicon for the FRE RTO process at temperatures of 1100° C. and 1050° C. with a dry oxygen (Dry) process of the prior art at 1050° C. The trend lines are indicated as guidelines. FIGS. 7 and 8 show that the difference in the rates is remarkably different from any other standard processes of oxidation shown in FIGS. 1–4.

Figure 9:
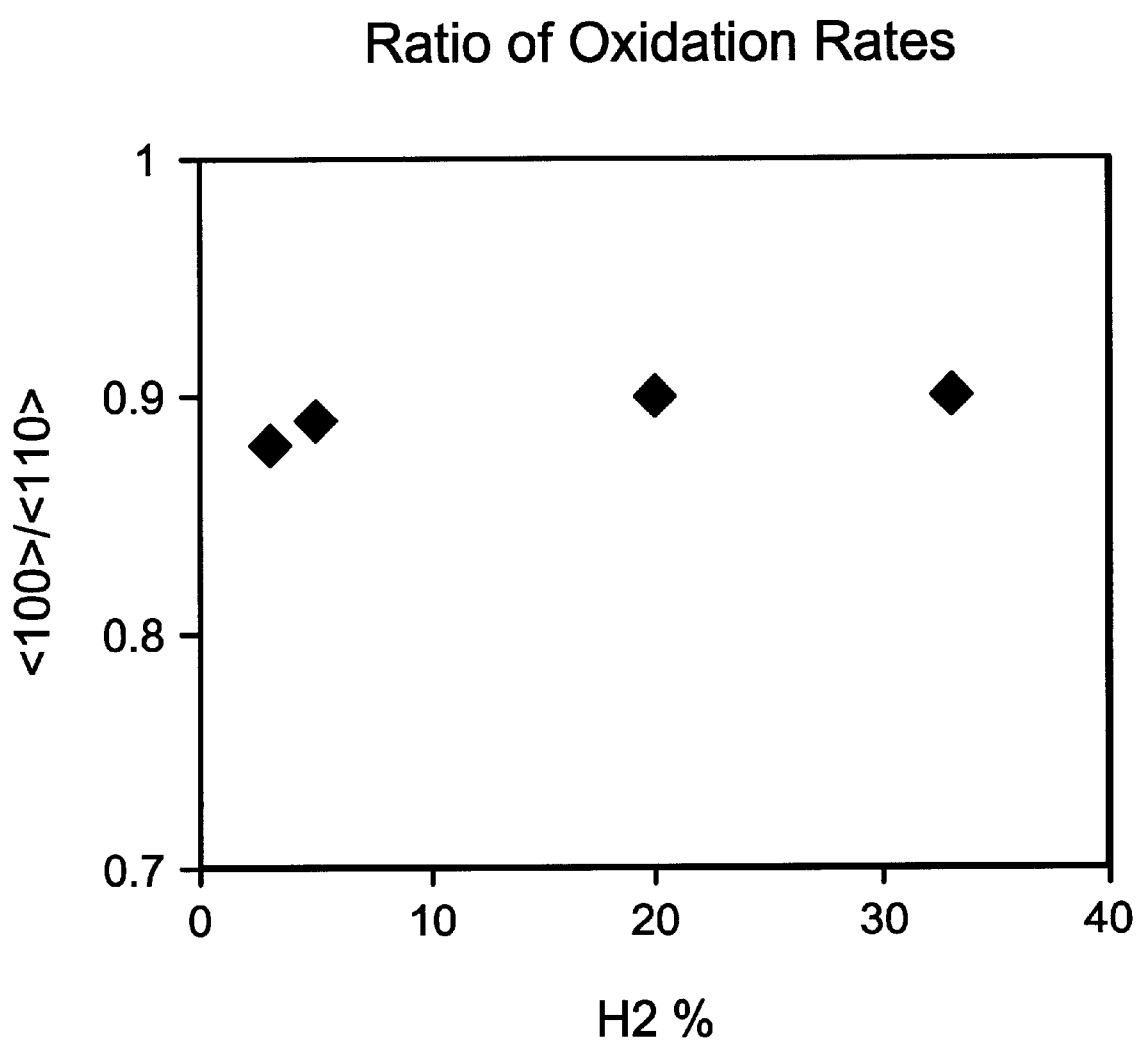
FIG. 9 is a plot of a ratio of the rate of oxidation ($SiO_2$) between planes (100) and (110) of silicon versus $H_2$ content in a chamber at 10 Torr in accordance with the present invention.

The present invention forms high-quality uniform oxide films on complex 3-D silicon surfaces at relatively low thermal budgets. In addition, we have found that this remarkable property of the FRE RTO oxidation process depends weakly on the film thickness (See, e.g., FIG. 7), content of hydrogen in the mixture (as shown in FIG. 9), and process temperature (see, e.g., FIG. 8). FIG. 9 shows the oxidation rate ratio of silicon dioxide films ((100)/(110)) versus percent $H_2$. The rate ratio remains substantially constant over a wide range of percent $H_2$.

Returning to FIG. 6, in block 109, an optional anneal of the structure after oxidation may be performed. The anneal is preferably at a temperature of between about 600° C. and about 1200° C. in an ambient which may include one or more of the following illustrative gases or combinations thereof: $O_2$, $N_2$, $H_2$, $N_2O$, NO, $NH_3$, and Ar. By annealing the oxide film, a nitride is preferably formed on the oxide film to improve dielectric quality.

Figure 1:
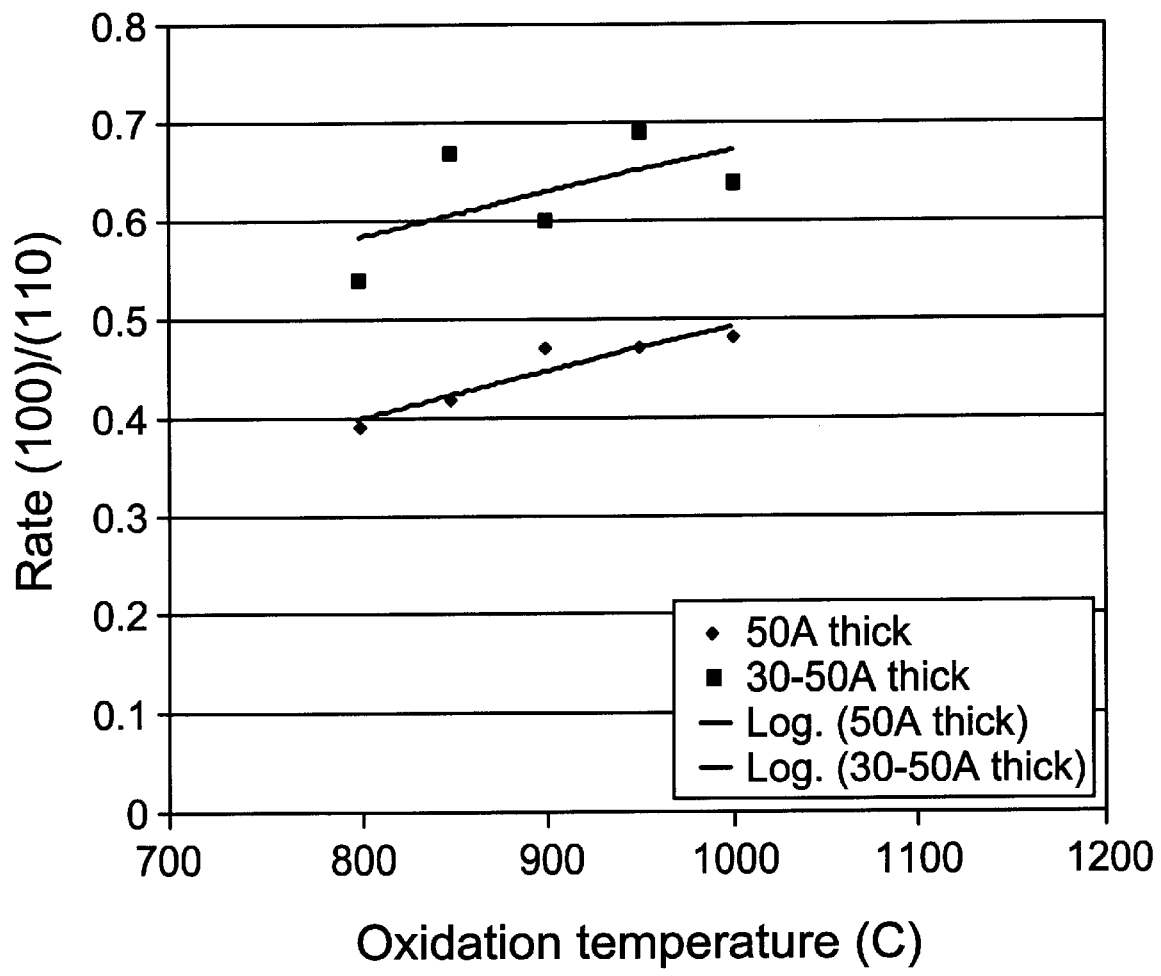
FIG. 1 is a plot of a ratio of the rate of oxidation between planes (100) and (110) of silicon versus temperature in accordance with the prior art.
Figure 2:
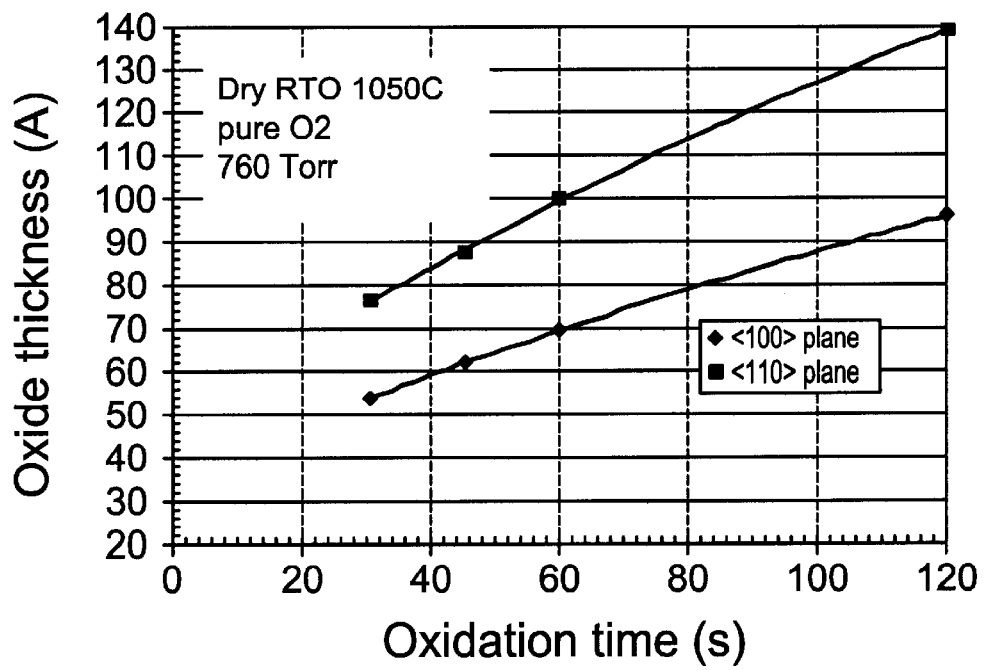
FIG. 2 is a plot of oxide thickness versus oxidation time for planes (100) and (110) of silicon for rapid thermal oxidation in accordance with the prior art.
Figure 3:
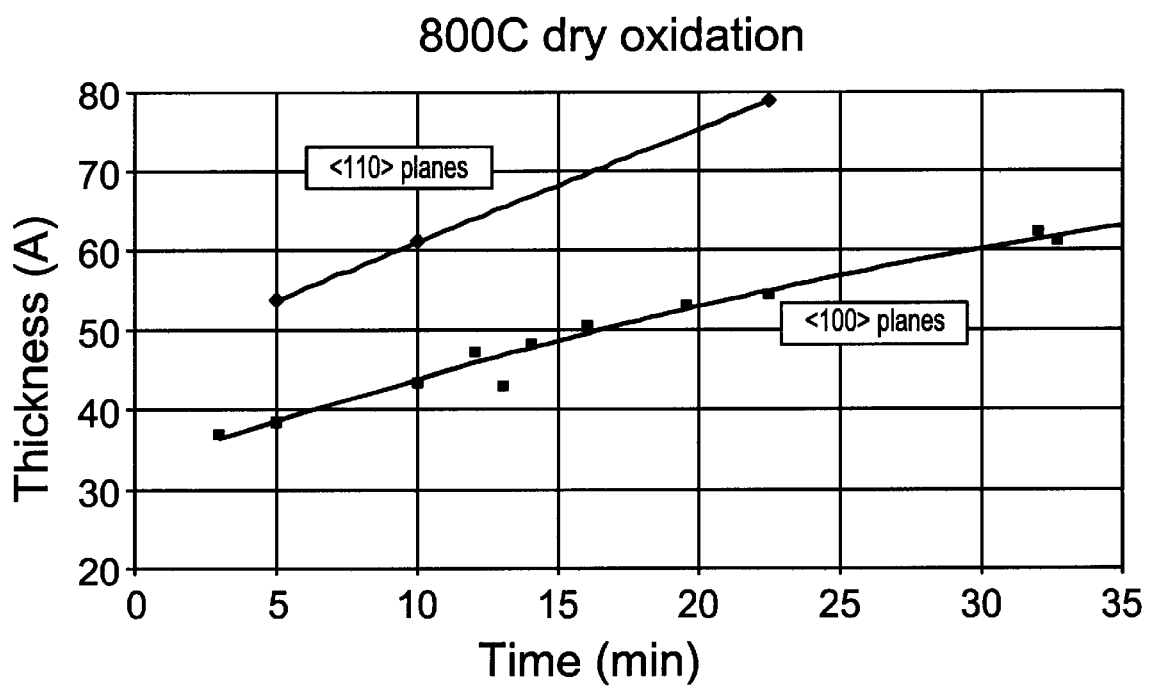
FIG. 3 is a plot of oxide thickness versus oxidation time for planes (100) and (110) of silicon for dry oxidation in accordance with the prior art.
Figure 4:
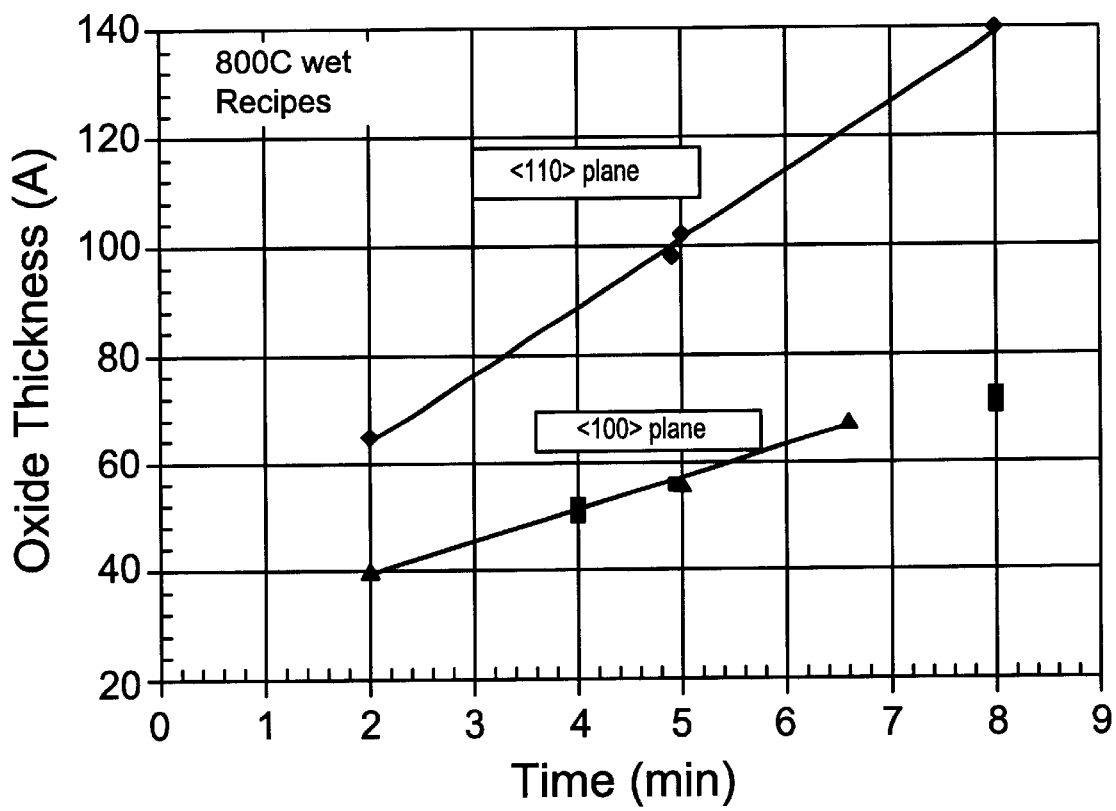
FIG. 4 is a plot of oxide thickness versus oxidation time for planes (100) and (110) of silicon for wet oxidation in accordance with the prior art.
Figure 5:
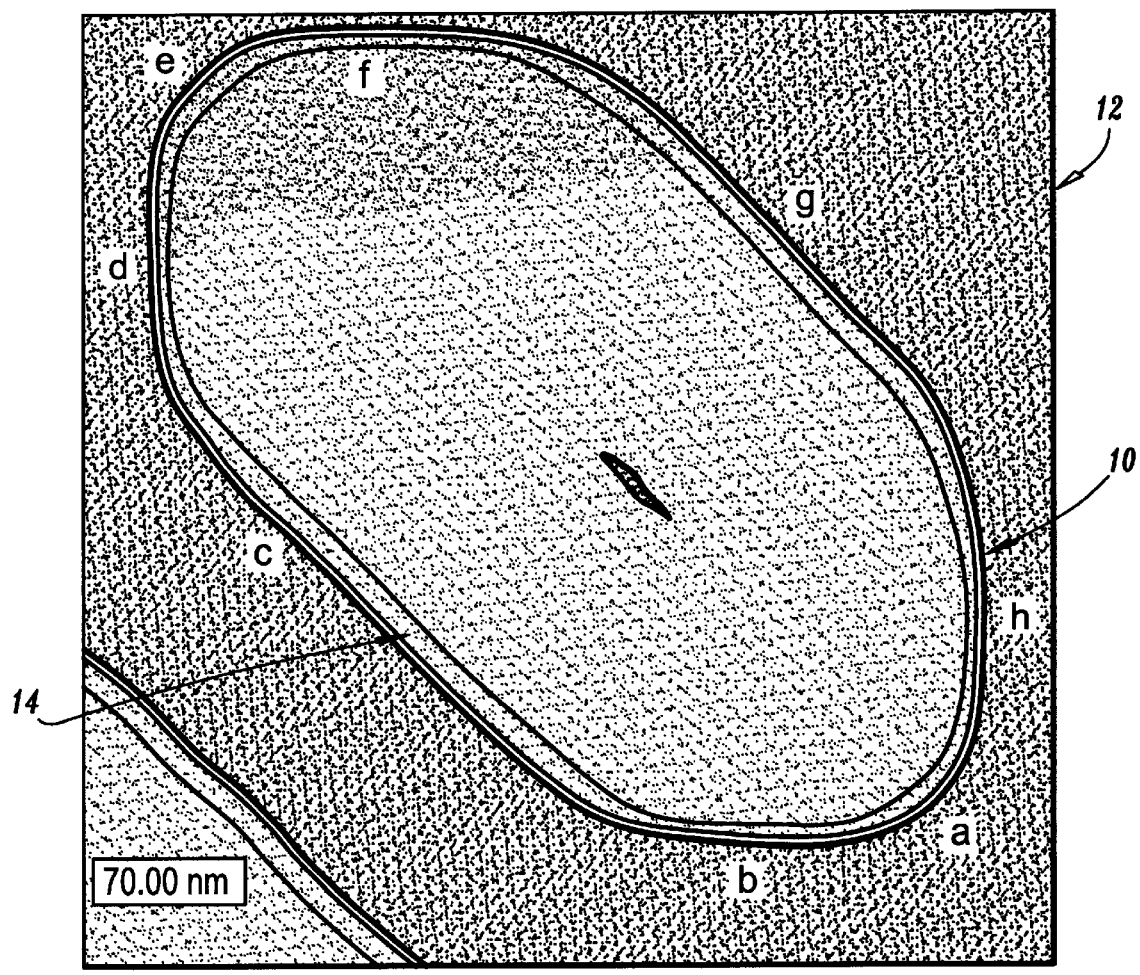
FIG. 5 is a top view image of a sectioned silicon substrate including a deep trench with an oxide film having an oxide thickness variation in accordance with planes (100) and (110) of silicon in accordance with the prior art.
Figure 10:
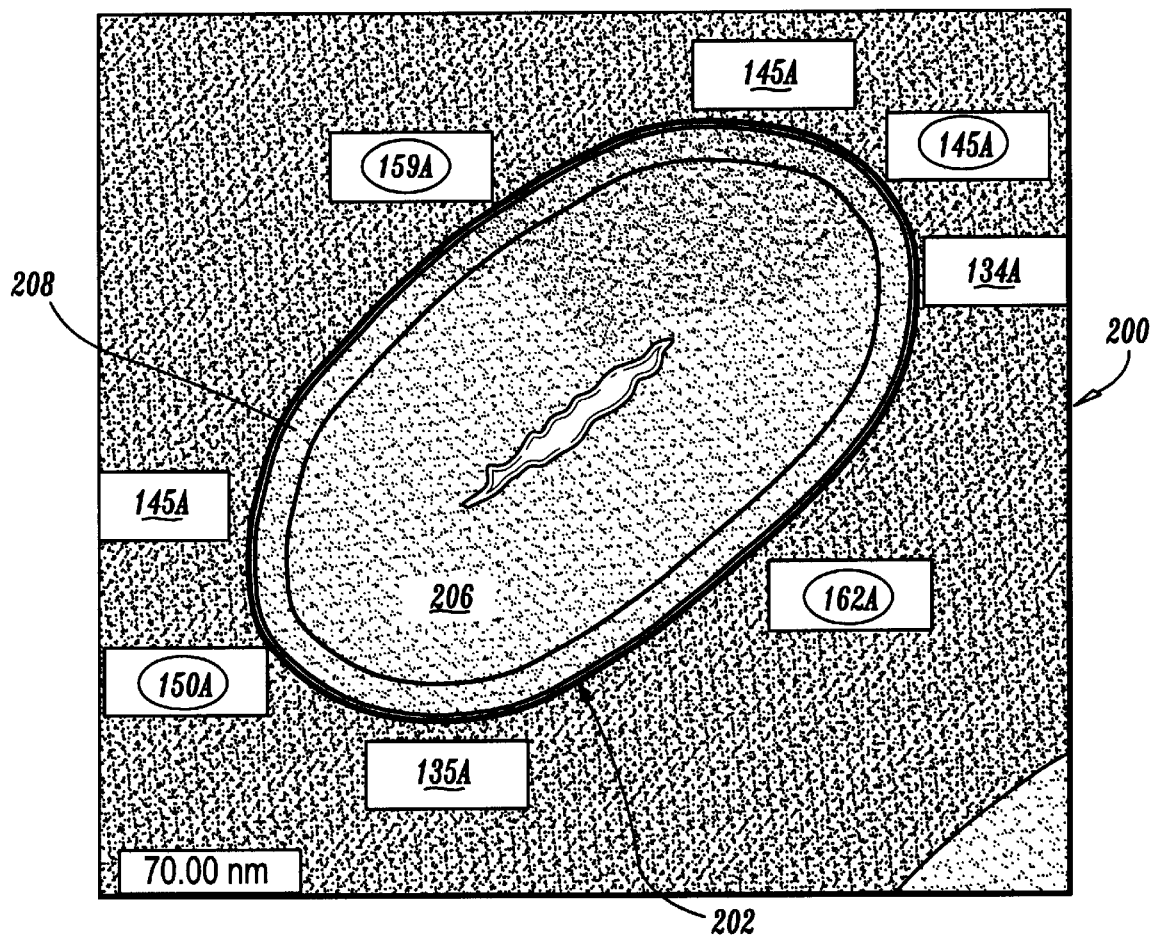
FIG. 10 is a top view image of a sectioned silicon substrate having an oxide film with substantially uniform oxide thickness despite the film deposition on planes (100) and (110) of silicon in accordance with the present invention.

Referring to FIG. 10, a method of the present invention was applied to a vertical trench 202 formed in a monocrystalline silicon substrate 200. Vertical trench 202 was oxidized by the FRE RTO method to produce a uniform gate insulator for a vertical transistor (not shown) to be formed on a sidewall of the trench. Trench 202 is shown filled with polysilicon 206 to permit the cross-section to be taken. A silicon oxide 208 has formed which is significantly more uniform about trench 202 than the prior art (see e.g., FIG. 5). The thickness is substantially uniform despite the different crystallographic planes. There is only a small difference in oxide thickness around the trench perimeter. Illustrative thickness dimensions are indicated. Thicknesses for the (110) are circled, while the thicknesses for the (100) are underlined.

Figure 11:
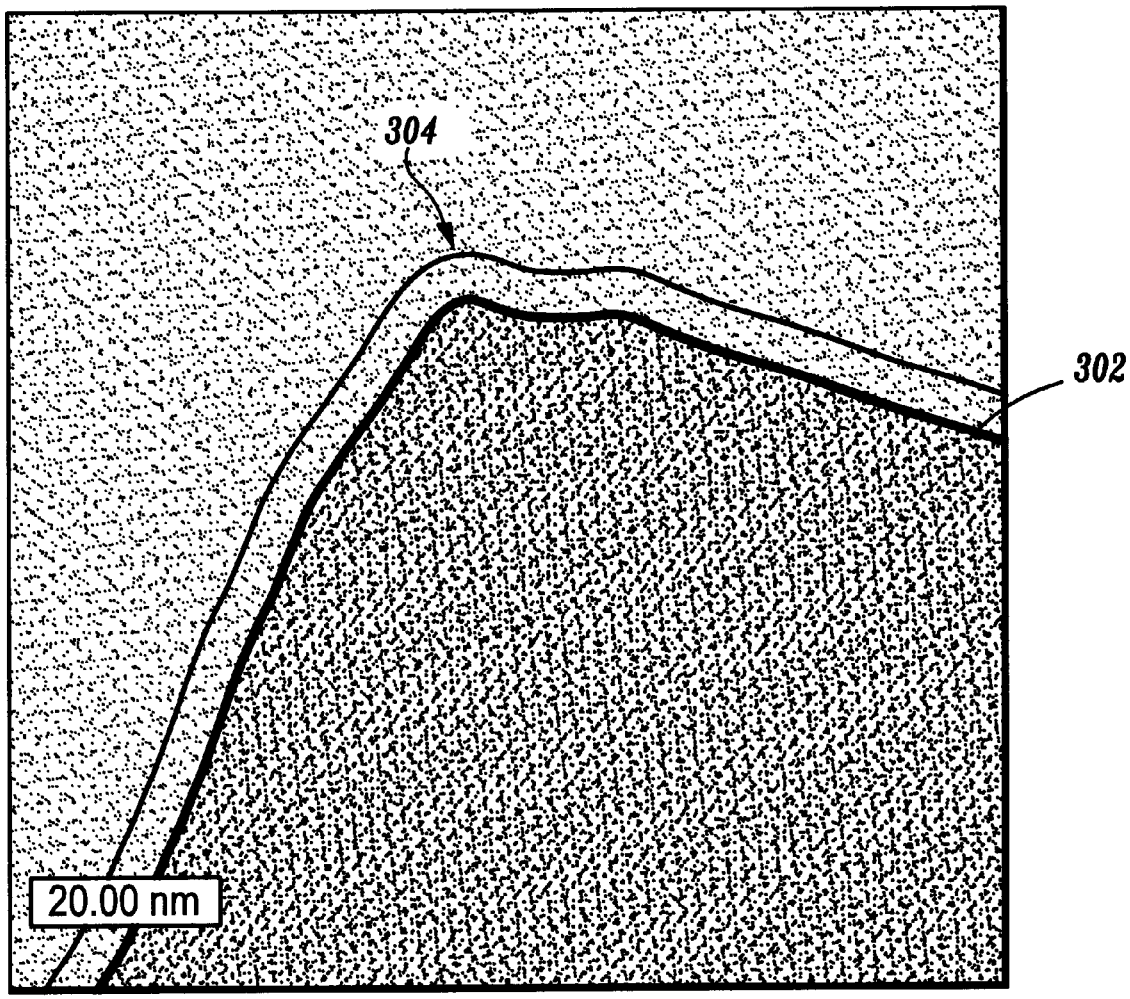
FIG. 11 is an image of a sectioned silicon substrate including a corner formed in the silicon, the corner having an oxide film with substantially uniform oxide thickness despite the film deposition on planes (100) and (110) in accordance with the present invention.

It is to be understood that the present invention should not be construed as limited to the fabrication of high-quality uniform oxides on the walls of trenches (for example deep trenches for semiconductor memory devices, pillars and/or vias, but rather general in scope and covers oxidation of any 3-D structure or, in particular, a silicon surface with at least two crystallographic planes. As an example, the formation of a high-quality uniform oxide film 302 is formed on a silicon corner 304 as shown in FIG. 11. The present invention may also find utility in other substrate types, which need a high-quality uniform thickness oxide formed thereon, or on polysilicon structures.

Having described preferred embodiments for a novel method for orientation independent oxidation of silicon (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims:

What is claimed is:

1. A method for simultaneously forming an oxide of substantially uniform thickness on at least two crystallographic planes of silicon comprising the steps of:
   providing a substrate including surfaces having at least two different crystallographic orientations of the silicon crystal;
   forming atomic oxygen for oxidizing the surfaces; and
   forming an oxide on the surfaces by reacting the atomic oxygen with the surfaces to simultaneously form a substantially uniform thickness of the oxide on the at least two different crystallographic orientations of the surfaces, wherein the step of forming atomic oxygen for oxidizing the surfaces includes the step of forming atomic oxygen by employing a free radical enhances rapid thermal oxidation (FRE RTO) process.

2. The method as recited in claim 1, wherein the at least two different crystallographic orientations include two of planes (100), (110) and (111).

3. The method as recited in claim 1, wherein the step of providing a substrate including surfaces having at least two different crystallographic orientations of the silicon crystal includes the step of forming a three dimensional structure in the substrate.

4. The method as recited in claim 3, wherein the three-dimensional structure includes a trench, a pillar or a via.

5. The method as recited in claim 1, further comprising the step of annealing the oxide.

6. A method for simultaneously forming an oxide of substantially uniform thickness on at least two crystallographic planes of silicon comprising the steps of:
   providing a substrate including surfaces having at least two different crystallographic orientations of the silicon crystal;
   forming atomic oxygen for oxidizing the surfaces; and
   forming an oxide on the surfaces by reacting the atomic oxygen with the surfaces to simultaneously form a substantially uniform thickness of the oxide on the at least two different crystallographic orientations of the surfaces, wherein the step of forming atomic oxygen for oxidizing the surfaces includes the step of forming atomic oxygen by employing remote electrical discharge of oxygen.

7. A method for simultaneously forming an oxide of substantially uniform thickness on at least two crystallographic planes of silicon comprising the steps of:
   providing a substrate including surfaces having at least two different crystallographic orientations of the silicon crystal;
   forming atomic oxygen for oxidizing the surfaces; and
   forming an oxide on the surfaces by reacting the atomic oxygen with the surfaces to simultaneously form a substantially uniform thickness of the oxide on the at least two different crystallographic orientations of the surfaces, wherein the step of forming atomic oxygen for oxidizing the surfaces includes the step of forming atomic oxygen by decomposing an unstable oxygen-bearing gas, wherein the unstable oxygen-bearing gas includes ozone.

8. A method for simultaneously forming an oxide of substantially uniform thickness on at least two crystallographic planes of silicon comprising the steps of:
   providing a substrate including surfaces having at least two different crystallographic orientations of the silicon crystal;
   forming atomic oxygen for oxidizing the surfaces; and
   forming an oxide on the surfaces by reacting the atomic oxygen with the surfaces to simultaneously form a substantially uniform thickness of the oxide on the at least two different crystallographic orientations of the surfaces, wherein a maximum thickness difference of the oxide film grown on the at least two different crystallographic planes is less than 20%.

9. A method for simultaneously forming an oxide of substantially uniform thickness on at least two crystallographic planes of silicon comprising the steps of:

providing a substrate including surfaces having at least two different crystallographic orientations of the silicon crystal;

forming atomic oxygen for oxidizing the surfaces; and forming an oxide on the surfaces by reacting the atomic oxygen with the surfaces to simultaneously form a substantially uniform thickness of the oxide on the at least two different crystallographic orientations of the surfaces, further including the step of annealing the oxide at a temperature between 600 degrees C. and 1200 degrees C. in an ambient.

10. The method as recited in claim 9, wherein the ambient includes at least one of: $O_2$, $N_2$, $H_2$, $N_2O$, NO, $NH_3$, and Ar.

11. A method for forming an oxide of substantially uniform thickness on at least two crystallographic planes of silicon comprising the steps of:

providing a substrate;

forming a continuous surface including at least two different crystallographic orientations of the silicon crystal on the substrate;

forming atomic oxygen to react with the continuous surface; and forming an oxide on the continuous surface by reacting the atomic oxygen with the continuous surface to simultaneously form a substantially uniform thickness of the oxide on the at least two different crystallographic orientations.

12. The method as recited in claim 11, wherein the step of forming atomic oxygen includes the step of forming atomic oxygen by employing free radical enhanced rapid thermal oxidation (FRE RTO).

13. The method as recited in claim 11, wherein the step of forming atomic oxygen includes the step of forming atomic oxygen by employing remote electrical discharge of oxygen.

14. The method as recited in claim 11, wherein the step of forming atomic oxygen includes the step of forming atomic oxygen by decomposing an unstable oxygen-bearing gas.

15. The method as recited in claim 14, wherein the unstable oxygen-bearing gas includes ozone.

16. The method as recited in claim 11, wherein the at least two different crystallographic orientations include two of planes (100), (110), and (111).

17. The method as recited in claim 11, wherein a maximum thickness difference of the oxide film grown on the at least two different crystallographic planes is less than 20%.

18. The method as recited in claim 11, wherein the step of forming a continuous surface includes the step of forming a three dimensional structure in the substrate.

19. The method as recited in claim 18, wherein the three-dimensional structure includes a trench, a pillar or a via.

20. The method as recited in claim 11, further comprising the step of annealing the oxide.

21. The method as recited in claim 11, wherein the step of annealing the oxide includes the step of annealing the oxide at a temperature between 600 degrees C. and 1200 degrees C. in an ambient.

22. The method as recited in claim 21, wherein the ambient includes at least one of: $O_2$, $N_2$, $H_2$, $N_2O$, NO, $NH_3$, and Ar.

* * * * *